US010428883B2

United States Patent
Church et al.

(10) Patent No.: US 10,428,883 B2
(45) Date of Patent: Oct. 1, 2019

(54) DRUM BRAKE ASSEMBLY CONFIGURED TO REDUCE AUDIBLE NOISE DURING BRAKING

(71) Applicant: Bendix Spicer Foundation Brake LLC, Elyria, OH (US)

(72) Inventors: David R. Church, Richland, MI (US); Bret Allen Engels, West Bloomfield, MI (US); Edward Ray Green, Livonia, MI (US)

(73) Assignee: Bendix Spicer Foundation Brake LLC, Elyria, OH (US)

( * ) Notice: Subject to any disclaimer, the term of this patent is extended or adjusted under 35 U.S.C. 154(b) by 460 days.

(21) Appl. No.: 14/802,669

(22) Filed: Jul. 17, 2015

(65) Prior Publication Data

US 2017/0016496 A1    Jan. 19, 2017

(51) Int. Cl.
*F16D 65/08*     (2006.01)
*F16D 65/00*     (2006.01)
(Continued)

(52) U.S. Cl.
CPC ......... *F16D 65/0006* (2013.01); *F16D 51/22* (2013.01); *F16D 65/0018* (2013.01);
(Continued)

(58) Field of Classification Search
CPC .......... F16D 65/08; F16D 65/09; F16D 51/22; F16F 15/20
See application file for complete search history.

(56) References Cited

U.S. PATENT DOCUMENTS 1,132,541 A * 3/1915 Baker ................ F16D 51/22
                                                188/250 E
1,457,048 A * 5/1923 Thomas .............. F16D 51/22
                                                188/329
(Continued)

FOREIGN PATENT DOCUMENTS

EP          0976944 A1    2/2000
GB          2067693 A     7/1981
JP       2007211967 A     8/2007

OTHER PUBLICATIONS

Ahmed et al. Automotive Drum Brake Squeal Analysis Using Complex Eigenvalue Methods. International Journal of Modern Engineering Research. (Year: 2012).*
(Continued)

*Primary Examiner* — Bradley T King
*Assistant Examiner* — Stephen M Bowes
(74) *Attorney, Agent, or Firm* — Reising Ethington P.C.

(57) ABSTRACT

A drum brake assembly and method for designing the assembly are provided. The assembly includes a brake spider, a pair of brake shoes pivotally coupled to the brake spider at one end, and a pair of cam followers disposed at opposite ends of the brake shoes. The assembly further includes a camshaft having a shaft disposed along a rotational axis and a cam disposed at one end of the shaft. The cam has an inboard side proximate the shaft, an outboard side distant from the shaft and a cam surface extending between the inboard and outboard sides in engagement with the cam followers. The camshaft further includes a noise reducing mass disposed on the outboard side of the cam. The mass is configured to establish a natural frequency in the cam that differs from a natural frequency of the first and second brake shoes to reduce audible noise.

16 Claims, 5 Drawing Sheets

(51) Int. Cl.
*F16D 51/22* (2006.01)
*F16D 65/22* (2006.01)
*G06F 17/50* (2006.01)
*F16D 125/30* (2012.01)

(52) U.S. Cl.
CPC ......... *F16D 65/22* (2013.01); *G06F 17/5095* (2013.01); *F16D 2125/30* (2013.01)

(56) References Cited

U.S. PATENT DOCUMENTS

| | | | | |
|---|---|---|---|---|
| 2,682,319 A | * | 6/1954 | Bennett | B60T 1/067 188/79 |
| 4,773,512 A | | 9/1988 | Murakami | |
| 5,431,258 A | * | 7/1995 | Correa | F16D 65/08 188/250 E |
| 5,515,952 A | * | 5/1996 | Jackson | F16D 65/0006 188/250 E |
| 5,615,754 A | | 4/1997 | Kobayashi et al. | |
| 5,887,686 A | * | 3/1999 | Tanaka | F16D 65/00 188/250 E |
| 5,971,112 A | | 10/1999 | Okada et al. | |
| 2006/0016652 A1 | * | 1/2006 | Clark | F16D 65/08 188/330 |

OTHER PUBLICATIONS

Day et al. Noise and vibration analysis of an S-cam drum brake. University of Bradford, West Yorkshire. (Year: 1996).*
International Search Report issued in corresponding international application PCT/US2016/041877 (dated Oct. 12, 2016).
Written Opinion issued in corresponding international application PCT/US2016/041877 (dated Oct. 12, 2016).

* cited by examiner

DRUM BRAKE ASSEMBLY CONFIGURED TO REDUCE AUDIBLE NOISE DURING BRAKING

BACKGROUND OF THE INVENTION a. Field of the Invention

This invention relates to vehicle brakes. In particular, the invention relates to a drum brake assembly and method for designing a drum brake assembly in which a camshaft of the drum brake assembly is configured to reduce audible noise during braking.

b. Background Art

In a conventional drum brake, a drum rotates with a wheel or wheels proximate to one end of an axle. The drum defines a radially inner braking surface. A brake spider is disposed about the axle and a pair of brake shoes are pivotally mounted at one end to the brake spider. The opposite end of each brake shoe is engaged by an actuating member such as a cam to move the brake shoes between positions of engagement and disengagement with the braking surface of the brake drum.

Some drum brakes emit a long, high-pitched noise or squeal (e.g., a single tone noise within the audible range of humans typically between 60 and 120 decibels) during application of the brakes when the brake shoes engage the braking surface of the drum. This noise is unpleasant and distracting to the driver of the vehicle from which the noise emanates and to others within the audible range of the noise including drivers in surrounding vehicles. The noise can also result in warranty claims by vehicle owners asserting that the brake is not functioning properly.

The inventor herein has recognized a need for a drum brake assembly and a method of designing a drum brake assembly that will reduce one or more of the above-identified deficiencies and/or provide improved performance.

BRIEF SUMMARY OF THE INVENTION

This invention relates to vehicle brakes. In particular, the invention relates to a drum brake assembly and method for designing a drum brake assembly in which a camshaft of the drum brake assembly is configured to reduce audible noise during braking.

A drum brake assembly in accordance with one embodiment of the invention includes a brake spider having a central aperture configured to receive an axle extending therethrough along a center axis of the central aperture. The assembly further includes first and second brake shoes. Each of the first and second brakes shoes has a first end pivotally coupled to the brake spider. The assembly further includes a first cam follower disposed at a second end of the first brake shoe and a second cam follower disposed at a second end of the second brake shoe. The assembly further includes a camshaft having a shaft disposed along a rotational axis and a cam disposed at one end of the shaft. The cam has an inboard side proximate the shaft and an outboard side distant from the shaft and a cam surface extending between the inboard and outboard sides in engagement with the first and second cam followers. Movement of the cam causes the first and second brake shoes to move between positions of engagement and disengagement with an associated braking surface. The camshaft further includes a noise reducing mass disposed on the outboard side of the cam. The mass is configured to establish a natural frequency in the cam that differs from a natural frequency of the first and second brake shoes by at least 200 Hz.

A drum brake assembly in accordance with another embodiment of the invention includes a brake spider having a central aperture configured to receive an axle extending therethrough along a center axis of the central aperture. The assembly further includes first and second brake shoes. Each of the first and second brakes shoes has a first end pivotally coupled to the brake spider. The assembly further includes a first cam follower disposed at a second end of the first brake shoe and a second cam follower disposed at a second end of the second brake shoe. The assembly further includes a camshaft having a shaft disposed along a rotational axis and a cam disposed at one end of the shaft. The cam has an inboard side proximate the shaft and an outboard side distant from the shaft and a cam surface extending between the inboard and outboard sides in engagement with the first and second cam followers. Movement of the cam causes the first and second brake shoes to move between positions of engagement and disengagement with an associated braking surface. The camshaft further includes a noise reducing mass configured to establish a natural frequency in the cam that differs from a natural frequency of the first and second brake shoes by at least 200 Hz. The noise reducing mass has a shape that is symmetrical about the rotational axis and is disposed at a location along the rotational axis such that the noise reducing mass is disposed at a node of a standing wave formed by vibration of the cam at the natural frequency of the cam.

A drum brake assembly in accordance with another embodiment of the invention includes a brake spider having a central aperture configured to receive an axle extending therethrough along a center axis of the central aperture. The assembly further includes first and second brake shoes. Each of the first and second brakes shoes has a first end pivotally coupled to the brake spider. The assembly further includes a first cam follower disposed at a second end of the first brake shoe and a second cam follower disposed at a second end of the second brake shoe. The assembly further includes a camshaft having a shaft disposed along a rotational axis and a cam disposed at one end of the shaft. The cam has an inboard side proximate the shaft and an outboard side distant from the shaft and a cam surface extending between the inboard and outboard sides in engagement with the first and second cam followers. Movement of the cam causes the first and second brake shoes to move between positions of engagement and disengagement with an associated braking surface. The camshaft further includes noise reducing means for establishing a natural frequency in the cam that differs from a natural frequency of the first and second brake shoes by at least 200 Hz.

A method of designing a drum brake assembly in accordance with one embodiment of the invention includes determining a natural frequency of a brake shoe of the drum brake assembly. The brake shoe has a first end configured to be pivotally coupled to a brake spider, the brake spider having a central aperture configured to receive an axle extending therethrough along a center axis of the central aperture, and a second end configured to engage a cam follower that moves in response to rotation of cam of a camshaft, movement of the cam causing the brake shoe to move between positions of engagement and disengagement with an associated braking surface. The method further includes configuring the camshaft of the drum brake assembly such that the cam of the camshaft has a natural frequency that differs from the natural frequency of the brake shoe by at least 200 Hz.

A drum brake assembly and method for designing a drum brake assembly in accordance with the invention represents an improvement as compared to conventional drum brake assemblies and methods for designing drum brake assemblies. As noted hereinabove, conventional drum brake assemblies emit a long, high-pitched noise or squeal during application of the brakes when the brake shoes engage the braking surface of the drum. It has been determined that this noise results, in part, from resonance of natural frequencies in the brake drum, brake shoes and other brake components such as the brake spider and vehicle components including, for example, steer axles and steering arms. The inventors herein have determined that configuring the camshaft to adjust its natural frequency in such a way that the natural frequency of the camshaft differs from that of the brake shoes has a particularly beneficial effect in reducing the resonance in the braking system and typical squeal that occurs during engagement of the brake by, in part, reducing an operating deflection shape of the cam.

The foregoing and other aspects, features, details, utilities, and advantages of the present invention will be apparent from reading the following description and claims, and from reviewing the accompanying drawings.

DETAILED DESCRIPTION OF THE INVENTION

Figure 1:
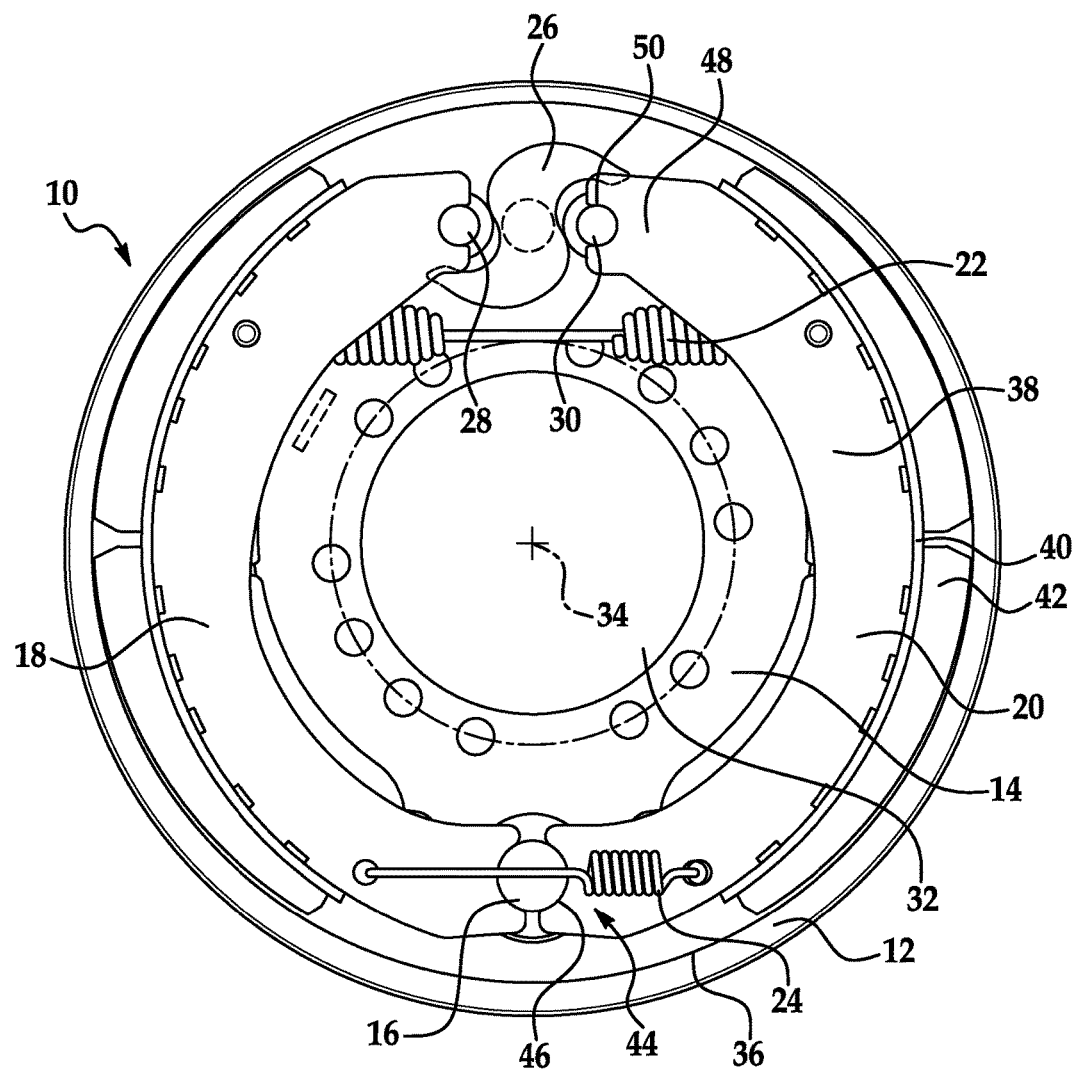
FIG. 1 is a plan view of a drum brake assembly in accordance with one embodiment of the present teachings.

Referring now to the drawings wherein like reference numerals are used to identify identical components in the various views, FIG. 1 illustrates a drum brake assembly 10 in accordance with one embodiment of the present invention. Brake 10 is provided to slow rotation of one or more vehicle wheels. Brake 10 is particularly adapted for use in heavy vehicles. It should be understood, however, that brake 10 may be used on a wide variety of vehicles and in non-vehicular applications. Brake 10 is configured to act against an annular brake drum 12 that rotates with the vehicle wheel or wheels at one end of an axle (not shown). Brake 10 may include a brake spider 14, one or more anchor pins 16, brake shoes 18, 20, return and retaining springs 22, 44, and means, such as camshaft 26 and rollers or cam followers 28, 30, for moving brake shoes 18, 20 between positions of engagement and disengagement with a braking surface.

Spider 14 is provided to mount the various components of brake 10. Spider 14 defines a central aperture 32 having a center axis 34 which may be coincident with the rotational axis of the vehicle wheel. The aperture 32 is configured to receive a vehicle axle extending therethrough and along axis 34. Spider 14 may further define bores (not shown) on either side of aperture 32 configured to receive anchor pin 16 and a camshaft (not shown) supporting camshaft 26.

Anchor pin 16 is provided to pivotally mount brake shoes 18, 20 to brake spider 14. Anchor pin 16 may comprise a round pin and may be mounted on and extend from brake spider 14. Although only a single anchor pin 16 is shown in the illustrated embodiment, it should be understood that brake shoes 18, 20 may be mounted on separate anchor pins 16 at some distance apart.

Brake shoes 18, 20 are provided for selective engagement with a braking surface 36 of drum 12 in order to apply a braking torque to the drum and one or more vehicle wheels. Brake shoes 18, 20 are supported on anchor pin(s) 16 and thereby pivotally coupled to spider 14 at one end. Each brake shoe 18, 20 may include one or more webs 38, a brake table 40, and one or more brake linings 42.

Webs 38 support brake table 40. Webs 38 may also provide a connection point for return spring 22 and retaining spring 24. Webs 38 may be made from metals and metal alloys such as steel. Webs 38 are arcuate in shape and extend between opposite ends of brake shoes 18, 20. It should be understood that the number of webs 38 in each brake 18, 20 may vary and each brake shoe 18, 20 may therefore include a plurality of webs 38 that extend generally parallel to one another. Webs 38 may be secured to brake table 40 using welds or other conventional fastening means. Each web 38 may have one end 44 that defines a semicircular recess 46 configured to receive a corresponding anchor pin 16 and an opposite end 48 that defines a semicircular recess 50 configured to engage one of rollers 28, 30.

Brake table 40 is provided to support brake linings 42. Table 40 is supported on webs 38 and may be arcuate in shape. Table 40 may be made from conventional metals and metal alloys including steel.

Brake linings 42 are provided for frictional engagement with braking surface 36 of drum 12. Linings 42 may be made from conventional friction materials. Brake linings 42 are disposed on brake table 40 and may be secured to brake table 40 using a plurality of rivets or other conventional fasteners including adhesives.

Return spring 22 is provided to bias brake shoes 18, 20 to a position of disengagement from the braking surface 36 of drum 12. Retainer springs 24 are provided to retain brake shoes 18, 20—and particularly webs 38—on anchor pin(s) 16. Springs 22, 24 are conventional in the art. The ends of spring 22 may engage pins (not shown) extending from webs 38 of brakes shoes 18, 20 while the ends of springs 24 extend through corresponding apertures in webs 38 of brake shoes 18, 20.

Figure 2:
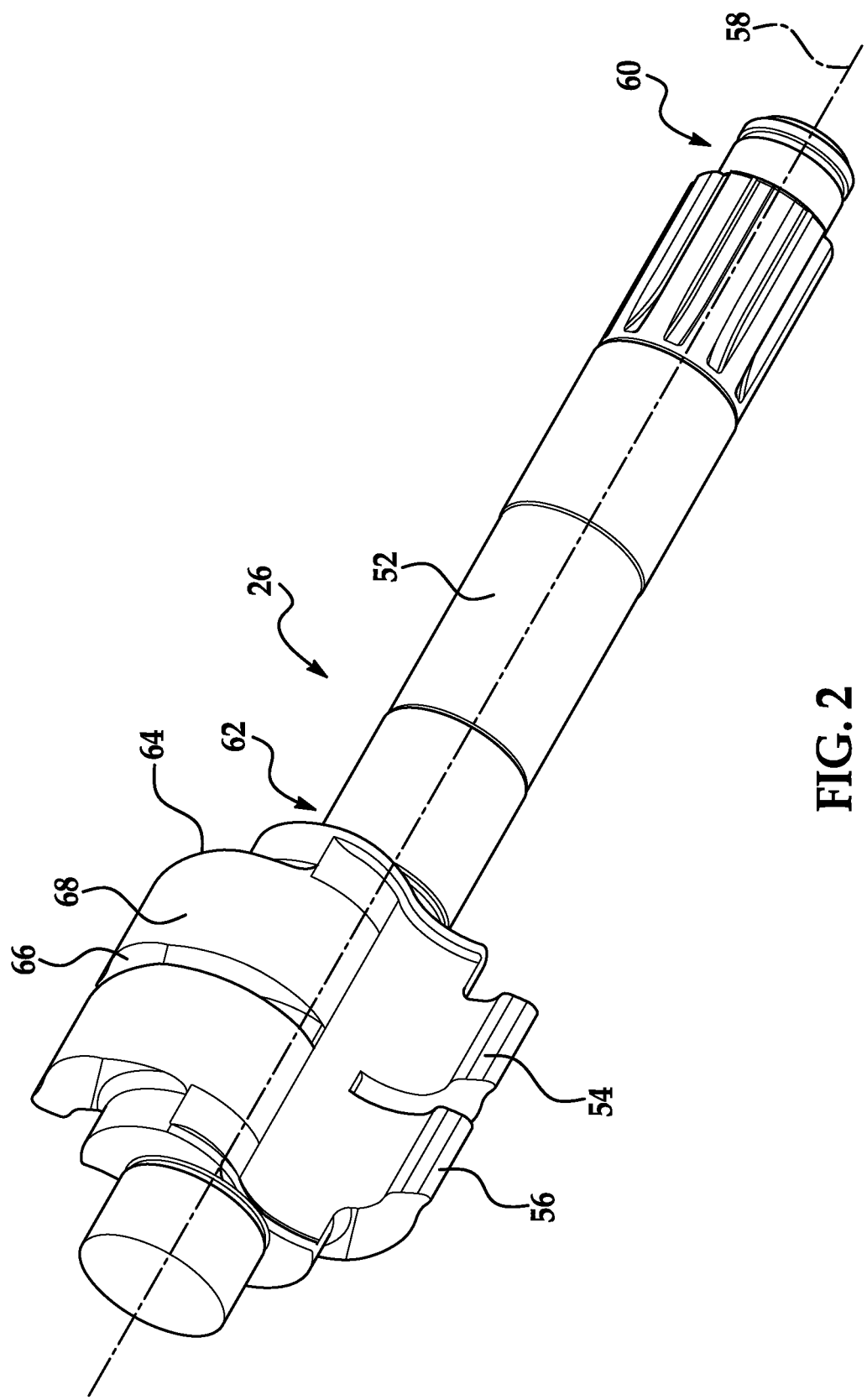
FIG. 2 is a perspective view of the camshaft of the drum brake assembly of FIG. 1.

Camshaft 26, together with rollers 28, 30, provides an actuating assembly or means for moving brake shoes 18, 20 between positions of engagement with and disengagement from the braking surface 36 of the drum 12. Referring to FIG. 2, camshaft 26 may include a shaft 52, a cam 54 and noise reducing means, such as noise-reducing mass 56, for establishing a natural frequency in cam 54 that differs from a natural frequency of brakes shoes 18, 20 for a purpose described hereinbelow.

Shaft 52 is provided to couple cam 54 to a brake actuator (not shown) and to position cam 54 relative to the other components of brake 10. Shaft 52 is generally circular in cross-section and configured for rotation about a rotational axis 58. One end 60 of shaft 52 is configured for coupling to brake actuator (not shown) that controls rotation of shaft 60 in order to apply or release brake 10. The brake actuator may, for example, include a fluid chamber and a pushrod extending from the chamber that engages a conventional slack adjuster coupled to end 60 of shaft 52. Fluid flow within the chamber is controlled to cause linear movement of the pushrod which is translated into rotational movement of shaft 52 by the slack adjuster to apply and release brake 10. The opposite end 62 of shaft 52 is configured for coupling to cam 54.

Cam 54 is provided to control the position and motion of cam followers 28, 30 in order to apply and release brake 10. In the illustrated embodiment, cam 54 comprises a doubled lobed S-cam that engages rollers 28, 30. Cam 54 is connected to one end 62 of shaft 52 and rotates about axis 58 responsive to forces imposed by a brake actuator (not shown) on the opposite end 60 of shaft 52. Cam 54 has an inboard side 64 proximate and facing towards shaft 52 and an outboard side 66 distant from and facing away from shaft 52. Cam 54 further includes a cam surface 68 extending between sides 64, 66 configured to engage cam followers 28, 30.

Figure 3:
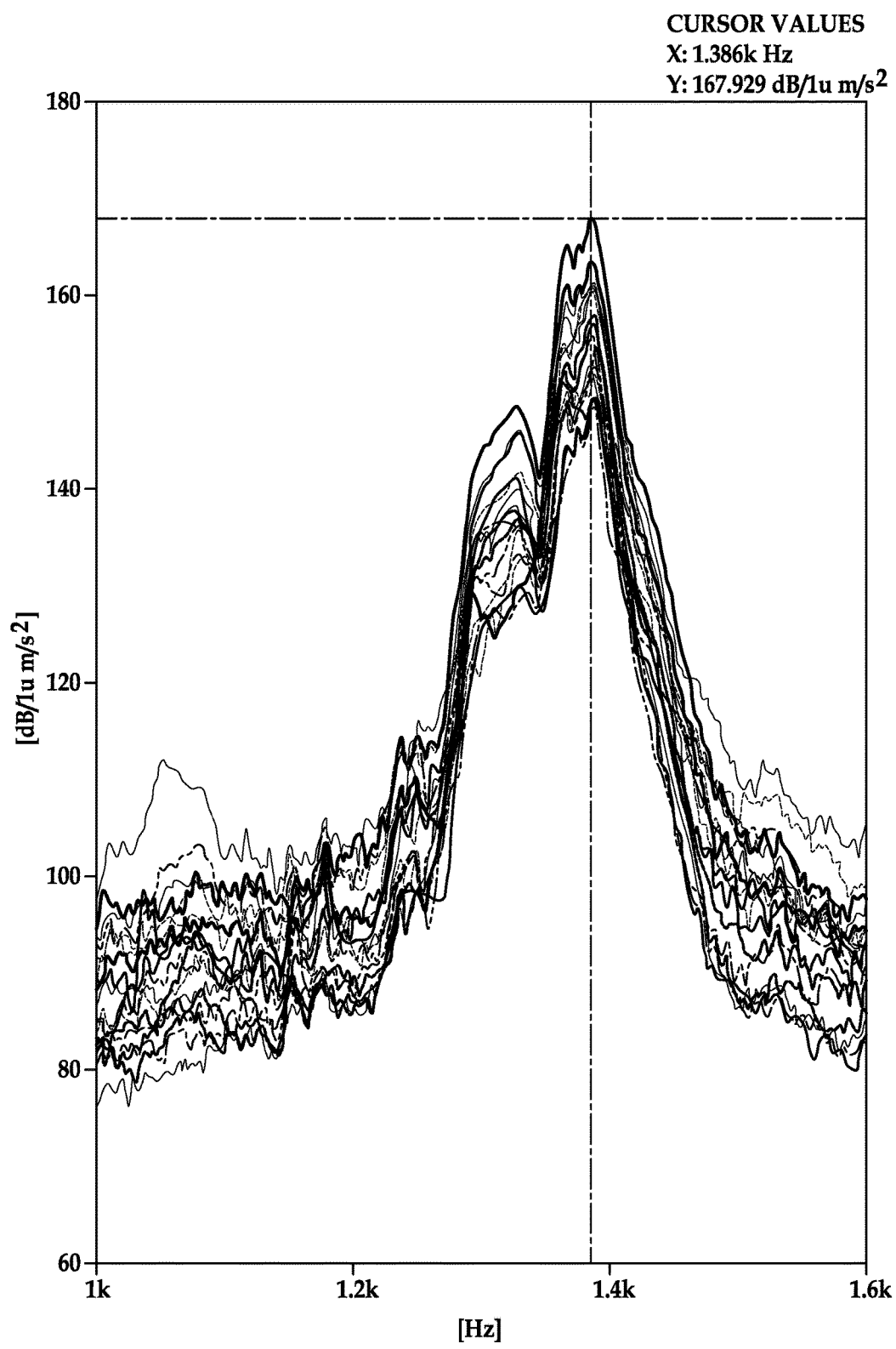
FIGS. 3-4 are line graphs illustrating decibel levels at various frequencies for a brake having a conventional camshaft and a brake having the camshaft of FIG. 2.
Figure 4:
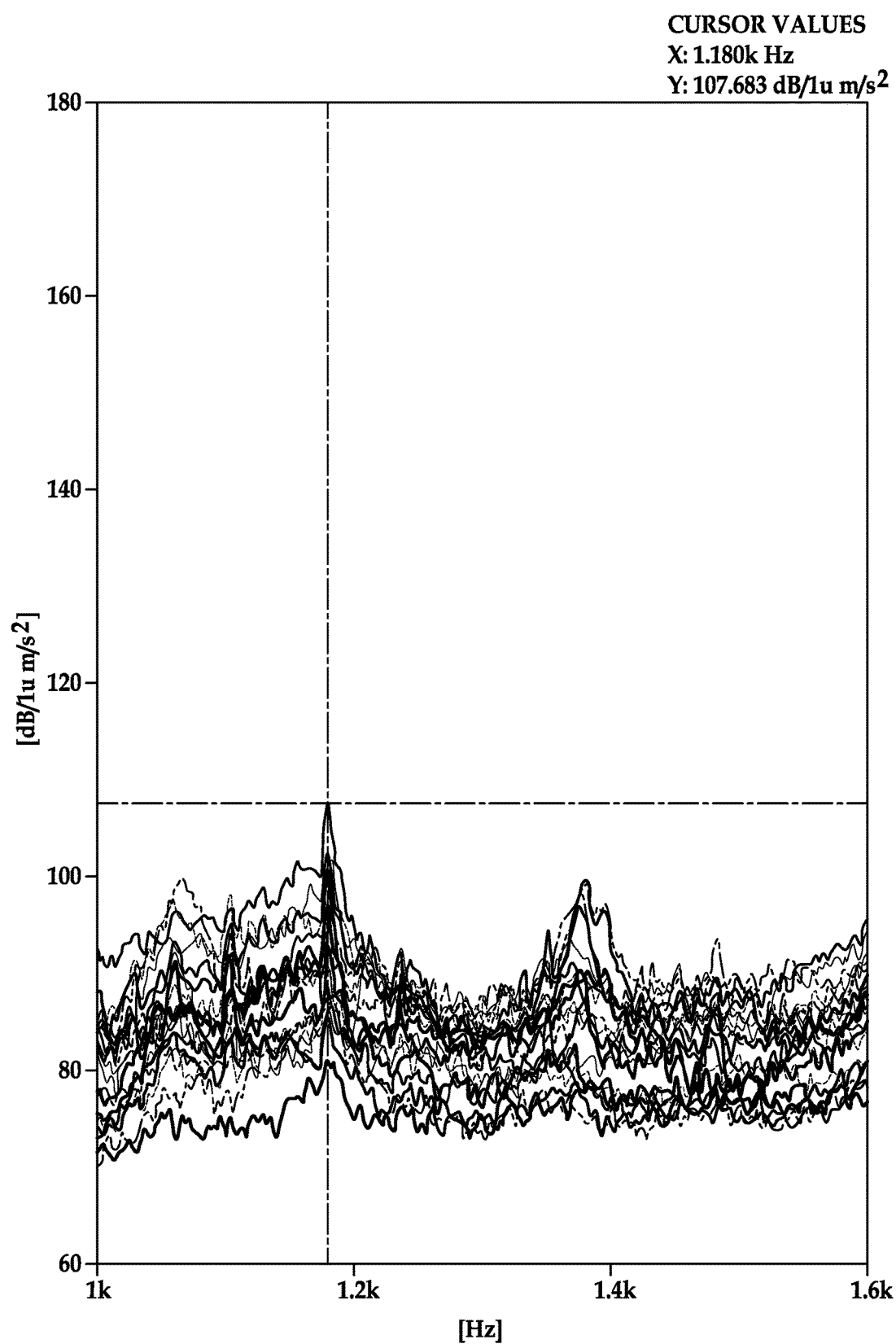
Figure 5:
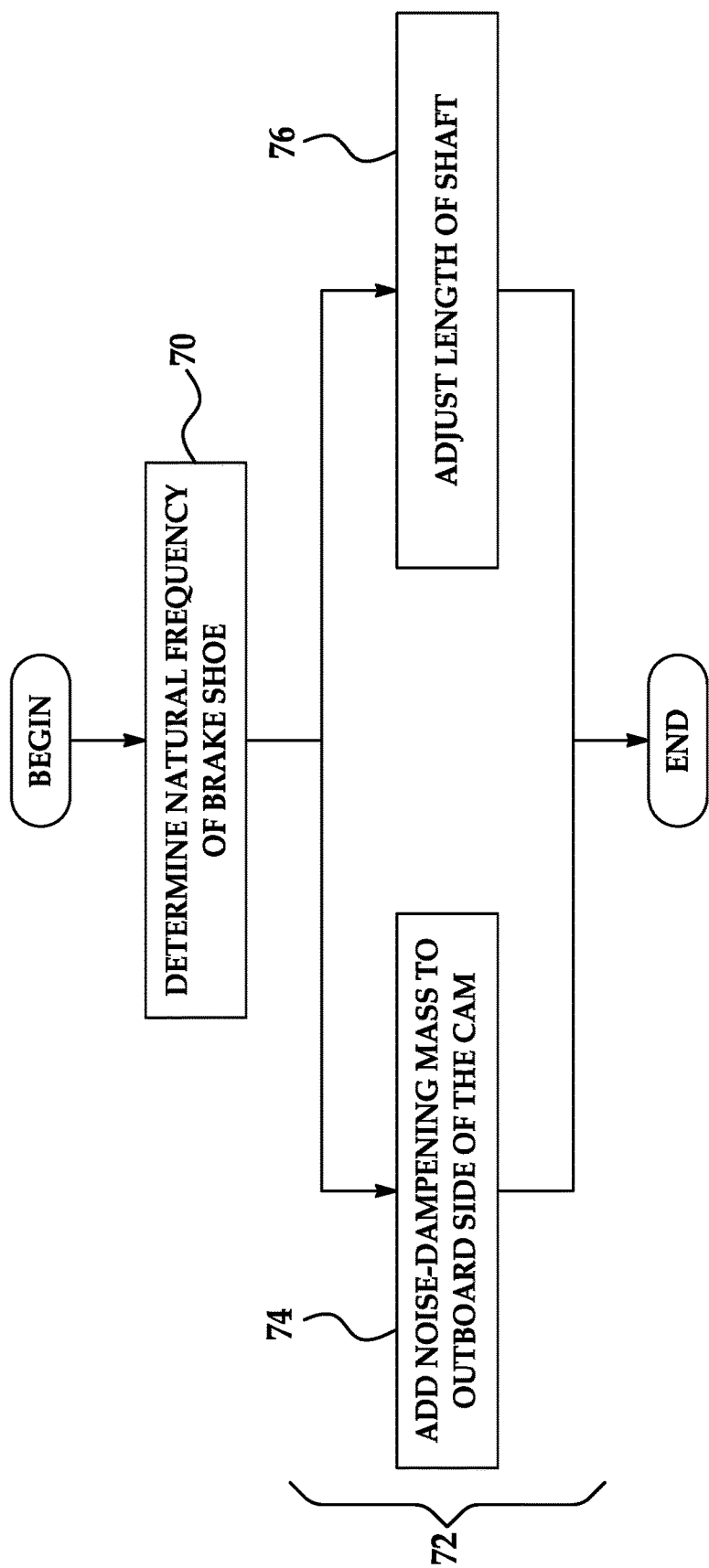
FIG. 5 is a flowchart diagram illustrating a method for designing a drum brake assembly in accordance with various embodiments of the present teachings.

Noise-reducing mass 56 is provided to alter a natural frequency of cam 54. As noted hereinabove, conventional drum brake assemblies emit a long, high-pitched noise or squeal during application of the brakes when the brake shoes engage the braking surface of the drum. It has been determined that this noise results, in part, from resonance of natural frequencies in the brake drum 12, brake shoes 18, 20 and other brake components such as the brake spider and vehicle components including, for example, steer axles and steering arms. The inventors herein have further determined, in particular, that a natural frequency of cam 54 in some drum brake assemblies is sympathetic to a natural frequency of the brake shoes 18, 20 as well as a natural frequency of the drum 12 such that cam 54, brake shoes 18, 20 and drum 12 will vibrate together near that frequency. During low pressure application of the brake 10, the natural frequencies of the brake drum 12, brake shoes 18, 20 and cam 54 combine in a way such that cam 54 suffers significant deflection and assumes an operating deflection shape that is circular in pattern. The operating deflection shape of cam 54 contributes to generation of a low frequency squeal by brake 10. The addition of mass 56 reduces the natural frequency of cam 54 to a lower natural frequency. In accordance with certain embodiments of the invention, a configuration for mass 56 is empirically determined to reduce or eliminate brake squeal. In particular, mass 56 may be configured to establish a lower natural frequency in cam 56 that will differ from the natural frequency of brake shoes 18, 20 by at least 200 Hz and, more preferably, by 250 Hz. Alternatively, mass 56 may be configured to establish a lower natural frequency in cam 56 that differs from the natural frequency of brakes shoes 18, 20 by at least twenty percent and, more preferably, by twenty-five percent. The change in the natural frequency of cam 54 also moves the nodes of standing waves for each harmonic or order based on that natural frequency. It has been found that movement of the nodes causes cam 54 to assume a non-circular operating deflection shape at the lower natural frequency of the cam 54 and an overall operating deflection shape that is less pronounced than cam 54 standing alone. This configuration has been found to have a particularly beneficial effect in reducing or eliminating the squeal found in conventional brakes and that cannot be accomplished with similar modifications to other braking and vehicle components such as the brake spider, steering arm or steer axle. FIGS. 3-4 show the averaged spectra of brake events from the beginning of brake actuation until a vehicle travelling at twenty (20) miles per hour comes to a stop with an applied actuator pressure of ten (10) to thirty (30) pounds per square inch (psi) for a brake employing a standard camshaft and brake 10 employing camshaft 26. As shown in the FIG. 3, a traditional brake emits a decibel reading of 167.929 dB/1 µm/sec² at a frequency of 1.386 kHz. A brake 10 employing camshaft 26 emits a much lower decibel reading of 107.683 dB/1 µm/sec² at a lower frequency of 1.180 kHz.

Mass 56 may be disposed on outboard side 66 of cam 54. Locating mass 56 on an outboard side 66 of cam 54 furthest from the applied force on shaft 52 allows mass 56 to have a greater impact on the natural frequency of cam 54. As a result of locating mass 56 on the outboard side of cam 54, mass 56 is disposed at an anti-node of a standing wave formed by vibration of cam 54 at the natural frequency of cam 54. Mass 56 may be disposed along axis 58 and symmetrical relative to axis 58. In the illustrated embodiment, mass 56 has the same shape and configuration as cam 54. Accordingly, mass 56 has a cross-sectional profile along a plane extending through mass 56 and perpendicular to axis 58 that is identical to the cross-sectional profile of cam 54 along a plane extending through cam 54 and perpendicular to axis 58. It should be understood, however, that the shape of mass 56 may vary. Mass 56 may also be spaced from cam along axis 58 as illustrated to position mass 56 at the anti-node of the standing wave formed by vibration of cam 54 at its natural frequency.

Referring again to FIG. 1, rollers 28, 30 are provided to transfer brake actuation forces from cam 26 to brake shoes 18, 20. Rollers 28, 30 are circular in cross-section and are configured to be received within recesses 50 of webs 38 formed at end 48 of shoes 18, 20. Rollers 28, 30 engage webs 38 and cam 26 and follow the surface of the cam 26 as it rotates thereby causing shoes 18, 20 to pivot about a pivot axis defined at the center of anchor pin 16.

Referring now to FIG. 3, various embodiments of a method for designing a drum brake assembly in accordance with the invention will be described. The method may begin with the step 70 of determining a natural frequency of a brake shoe 18, 20 of the drum brake assembly. The natural frequency of brake shoe 18, 20 may be determined using conventional measurement equipment including directly using, for example, a modal impact hammer, response accelerometers and signal analysis software or indirectly using modal analysis software. The method may continue with the step 72 of configuring camshaft 26 such that cam 54 has a natural frequency that differs from the natural frequency of the brake shoe 18, 20 by at 20 Hz (or, alternatively, by 20 percent). As discussed hereinabove, one way of configuring camshaft 26 to achieve this result is to add 74 a noise-reducing mass 56 to an outboard side 66 of cam 54. In an alternative embodiment, camshaft 26 may be configured by establishing a length of shaft 52 to alter the natural frequency of cam 54.

A brake 10 in accordance with the invention represents an improvement as compared to conventional brakes. In particular, by adjusting the natural frequency of cam 54 relative to that of brakes shoes 18, 20 and drum 12, cam 54 assumes a non-circular operating deflection shape at the lower natural frequency of the cam and an overall deflection that is less pronounced than cam 54 standing alone. This configuration reduces or eliminates the squeal found in conventional brakes.

While the invention has been shown and described with reference to one or more particular embodiments thereof, it will be understood by those of skill in the art that various changes and modifications can be made without departing from the spirit and scope of the invention.

What is claimed is:
1. A drum brake assembly, comprising:
   a brake spider having a central aperture configured to receive an axle extending therethrough along a center axis of the central aperture;

first and second brake shoes, each of said first and second brakes shoes having a first end pivotally coupled to said brake spider;
a first cam follower disposed at a second end of said first brake shoe;
a second cam follower disposed at a second end of said second brake shoe; and,
a camshaft having
    a shaft disposed along a rotational axis;
    a cam disposed at one end of the shaft, the cam having an inboard side proximate said shaft and an outboard side distant from said shaft and a cam surface extending between said inboard and outboard sides in engagement with said first and second cam followers, movement of said cam causing said first and second brake shoes to move between positions of engagement and disengagement with an associated braking surface; and,
    a noise reducing mass disposed on said outboard side of said cam, the mass configured to establish a natural frequency in said cam that differs from a natural frequency of said first and second brake shoes by at least 200 Hz.

2. The drum brake assembly of claim 1 wherein said mass has a cross-sectional profile along a first plane perpendicular to said rotational axis that is identical to a cross-sectional profile of said cam along a second plane perpendicular to said rotational axis.

3. The drum brake assembly of claim 1 wherein said mass is disposed at an anti-node of a standing wave formed by vibration of said cam at said natural frequency of said cam.

4. The drum brake assembly of claim 1 wherein said mass is configured to establish a natural frequency in said cam that differs from a natural frequency of said first and second brake shoes by at least 250 Hz.

5. The drum brake assembly of claim 4 wherein said mass is spaced from said cam along said rotational axis.

6. A drum brake assembly, comprising:
a brake spider having a central aperture configured to receive an axle extending therethrough along a center axis of the central aperture;
first and second brake shoes, each of said first and second brakes shoes having a first end pivotally coupled to said brake spider;
a first cam follower disposed at a second end of said first brake shoe;
a second cam follower disposed at a second end of said second brake shoe; and,
a camshaft having
    a shaft disposed along a rotational axis;
    a cam disposed at one end of the shaft, the cam having an inboard side proximate said shaft and an outboard side distant from said shaft and a cam surface extending between said inboard and outboard sides in engagement with said first and second cam followers, movement of said cam causing said first and second brake shoes to move between positions of engagement and disengagement with an associated braking surface; and,
    a noise reducing mass configured to establish a natural frequency in said cam that differs from a natural frequency of said first and second brake shoes by at least 200 Hz, said noise reducing mass having a shape that is symmetrical about the rotational axis and disposed at a location along the rotational axis such that said noise reducing mass is disposed at an anti-node of a standing wave formed by vibration of said cam at the natural frequency of said cam.

7. A drum brake assembly, comprising:
a brake spider having a central aperture configured to receive an axle extending therethrough along a center axis of the central aperture;
first and second brake shoes, each of said first and second brakes shoes having a first end pivotally coupled to said brake spider;
a first cam follower disposed at a second end of said first brake shoe;
a second cam follower disposed at a second end of said second brake shoe; and,
a camshaft having
    a shaft disposed along a rotational axis;
    a cam disposed at one end of the shaft, the cam having an inboard side proximate said shaft and an outboard side distant from said shaft and a cam surface extending between said inboard and outboard sides in engagement with said first and second cam followers, movement of said cam causing said first and second brake shoes to move between positions of engagement and disengagement with an associated braking surface; and,
    noise reducing means for establishing a natural frequency in said cam that differs from a natural frequency of said first and second brake shoes by at least 200 Hz.

8. The drum brake assembly of claim 7 wherein said noise reducing means is disposed on an outboard side of said cam.

9. The drum brake assembly of claim 7 wherein said noise reducing means is disposed at an anti-node of a standing wave formed by vibration of said cam at said natural frequency of said cam.

10. A method of designing a drum brake assembly, comprising:
determining a natural frequency of a brake shoe of the drum brake assembly, the brake shoe having a first end configured to be pivotally coupled to a brake spider, the brake spider having a central aperture configured to receive an axle extending therethrough along a center axis of the central aperture, and a second end configured to engage a cam follower that moves in response to rotation of cam of a camshaft, movement of the cam causing the brake shoe to move between positions of engagement and disengagement with an associated braking surface; and,
configuring the camshaft of the drum brake assembly such that the cam of the camshaft has a natural frequency that differs from the natural frequency of the brake shoe by at least 200 Hz.

11. The method of claim 10 wherein said configuring includes establishing a length of a shaft of said camshaft supporting said cam such that the cam has a natural frequency that differs from the natural frequency of the brake shoes by at least 200 Hz.

12. The method of claim 10 wherein said configuring includes adding a noise-reducing mass to an outboard side of the cam, the cam disposed at one end of a shaft of the camshaft that is configured to rotate about a rotational axis, the cam having an inboard side proximate said shaft and an outboard side distant from said shaft and a cam surface extending between said inboard and outboard sides configured to engage the cam follower, the noise-reducing mass configured to establish a natural frequency in said cam that differs from a natural frequency of said brake shoe by at least 200 Hz.

13. The method of claim 12 wherein said noise-reducing mass is configured to establish a natural frequency in said cam that differs from a natural frequency of said brake shoe by at least 250 Hz.

14. The method of claim 12 wherein said mass is disposed at an anti-node of a standing wave formed by vibration of said cam at said natural frequency of said cam.

15. The method of claim 12 wherein said mass has a cross-sectional profile along a first plane perpendicular to said rotational axis that is identical to a cross-sectional profile of said cam along a second plane perpendicular to said rotational axis.

16. The method of claim 15 wherein said mass is spaced from said cam along said rotational axis.

* * * * *